United States Patent
Small et al.

(10) Patent No.: US 7,037,350 B2
(45) Date of Patent: May 2, 2006

(54) COMPOSITION FOR CHEMICAL-MECHANICAL POLISHING AND METHOD OF USING SAME

(75) Inventors: Robert J. Small, Tucson, AZ (US); Zhefei J. Chen, Los Altos, CA (US)

(73) Assignee: DA NanoMaterials L.L.C., Tempe, AZ (US)

( * ) Notice: Subject to any disclaimer, the term of this patent is extended or adjusted under 35 U.S.C. 154(b) by 167 days.

(21) Appl. No.: 10/619,901

(22) Filed: Jul. 14, 2003

(65) Prior Publication Data

US 2005/0014890 A1    Jan. 20, 2005

(51) Int. Cl.
*B24B 1/00*    (2006.01)
*C08F 8/32*    (2006.01)

(52) U.S. Cl. .............. 51/298; 106/3; 438/692; 438/693; 216/100; 216/102; 216/103; 216/105; 216/106; 524/556; 524/557; 524/379; 524/387

(58) Field of Classification Search ............ 51/298; 106/3; 438/692, 693; 216/100, 102, 103, 216/105, 106; 524/556, 557; 525/379, 387; 361/226, 387; 204/164, 165
See application file for complete search history.

(56) References Cited

U.S. PATENT DOCUMENTS

| | | | |
|---|---|---|---|
| 4,655,957 A | 4/1987 | Chromecek et al. | |
| 4,855,127 A | 8/1989 | Abrutyn et al. | |
| 4,870,145 A | 9/1989 | Chromecek | |
| 4,948,818 A | 8/1990 | Carmody et al. | |
| 4,962,170 A | 10/1990 | Chromecek et al. | |
| 5,100,477 A | 3/1992 | Chromecek et al. | |
| 5,575,825 A | 11/1996 | Iida et al. | |
| 6,313,039 B1* | 11/2001 | Small et al. | 438/693 |
| 6,375,545 B1* | 4/2002 | Yano et al. | 451/36 |
| 2001/0049912 A1* | 12/2001 | Motonari et al. | 51/307 |
| 2002/0111024 A1* | 8/2002 | Small et al. | 438/689 |
| 2003/0079416 A1* | 5/2003 | Ma et al. | 51/307 |

FOREIGN PATENT DOCUMENTS

| | | |
|---|---|---|
| EP | 0 393 510 A1 | 10/1990 |
| EP | 1 020 488 A2 | 7/2000 |
| EP | 1 020 501 A2 | 7/2000 |
| EP | 1 036 836 A1 | 9/2000 |
| EP | 1138733 * | 10/2001 |

OTHER PUBLICATIONS

"*Acrylic Ultra-Fine Powder—MP Series*," Esprit Chemical Company of Sarasota, Florida, (no date).
"*Monodispersed Grains for Photographic Films—'SF Series'*," Esprit Chemical Company of Sarasota, Florida, (no date).
"*MX Series—Mono Dispersed PMMA Beads*," Esprit Chemical Company of Sarasota, Florida, (no date).

* cited by examiner

*Primary Examiner*—Michael Marcheschi
(74) *Attorney, Agent, or Firm*—Morgan Lewis & Bockius LLP

(57) ABSTRACT

A composition for chemical-mechanical polishing, comprising an aqueous solution and an abrasive that comprises polymer particles, is described. The polymer particles carry an electrical charge, such that nearby particles repel one another. Accordingly, aggregation of polymer particles may be reduced, minimized or eliminated. The composition may additionally comprise an oxidizing agent. A method of using the composition to polish a substrate surface, such as a substrate surface having a metal surface feature or layer, is also described. A substrate so polished may exhibit good surface characteristics, such as a relatively smooth surface or a reduced number of, or a lack of, microscratches on the surface of the substrate.

26 Claims, 2 Drawing Sheets

COMPOSITION FOR CHEMICAL-MECHANICAL POLISHING AND METHOD OF USING SAME

FIELD OF THE INVENTION

The invention relates generally to a composition that is usefully employed in chemical-mechanical polishing processes, and an associated method of polishing a substrate. More particularly, the invention relates to a composition comprising an abrasive composed of polymeric particles. The composition is useful in the polishing of various features or layers, such as metal layers, on substrates.

BACKGROUND OF THE INVENTION

A semiconductor wafer, such as a silicon or a gallium arsenide wafer, generally has a substrate surface on which one or more integrated circuits is formed. The substrate surface is desirably as flat, or planar, as possible before the surface is processed to form the integrated circuits. A variety of semiconductor processes are used to form the integrated circuits on the flat surface, during which the wafer takes on a defined topography. If this topography is too irregular or includes surface imperfections, fabrication processes, such as photolithography, are often compromised, and the resulting semiconductor device is often inoperable or highly subject to failure. Thus, it is often necessary to polish the wafer surface to render it as planar or uniform as possible and to remove surface imperfections.

Chemical-mechanical polishing or planarization (CMP) processes are well-known. See, for example, *Chemical Mechanical Polishing in Silicon Processing*, Semiconductors and Semimetals, Vol. 63, Edited by Li, S. et al. CMP processes are commonly used to polish or "planarize" the surfaces of wafers at various stages of fabrication to improve wafer yield, performance and reliability. In CMP, typically the wafer is held in place on a carrier using negative pressure, such as vacuum, or hydrostatic or pneumatic pressure. The carrier is typically situated over a polishing pad that is situated on a platen. CMP generally involves applying a polishing composition or slurry to the polishing pad, establishing contact between the wafer surface and the polishing pad, and applying a downward pressure on the wafer carrier while providing relative motion, typically rotational or orbital motion, between the wafer surface and the polishing pad. Typically, this relative motion involves movement of both the carrier and the platen at the same or different speeds.

The polishing composition typically contains an abrasive material, such as silica and/or alumina particles, in an acidic, neutral, or basic solution. Merely by way of example, a polishing composition useful in the CMP of tungsten material on a substrate may contain abrasive alumina ($Al_2O_3$), also called aluminum oxide, an oxidizing agent such as hydrogen peroxide ($H_2O_2$), and either potassium hydroxide (KOH) or ammonium hydroxide ($NH_4OH$). A CMP process employing such a polishing composition may provide a predictable rate of polishing, while largely preserving desirable insulation features on the wafer surface.

CMP is used in a variety of semiconductor processes to polish wafers having a variety of surface features, such as oxide and/or metal layers. By way of example, often the surface of a semiconductor wafer has insulation or oxide features, the grooves or stud vias of which are filled with a metal or a metal alloy. Typical filler metals or alloys include aluminum, copper, titanium, titanium nitride, tantalum, tantalum nitride, tungsten, and any combination of these metals or alloys. For such a semiconductor wafer, a typical CMP process involves polishing the metal in a controlled manner to remove unwanted metal and "stop on" the oxide beneath the metal, such that the remaining metal is substantially coplanar with the oxide and remains in the grooves or stud vias of the oxide. After CMP, the substantially coplanar surface is ready for further processing. CMP is currently the primary method used to polish or "planarize" wafers in back end of the line (BEOL) processes.

Semiconductor fabrication processes such as photolithography have evolved significantly, such that advanced devices having very fine oxide, metal, and other surface features, with sub-0.25 micron geometries (such as 0.18 micron or less), are now being made. Process tolerances are necessarily tighter for these advanced devices, calling for improvements in CMP technology to obtain desired material removal rates while minimizing wafer defects or damage. A variety of approaches have been taken in an effort to improve CMP processes.

One approach has involved increasing the downward pressure on the wafer carrier in order to increase material removal rates. This approach is generally disfavored as the requisite downward pressure is considered too high and too likely to cause wafer damage, such as scratching, delamination, or destruction of material layers on the wafer. When the wafer is fragile, as is generally the case with substrates layered with films, such as porous films, having a low dielectric constant, these damage issues are particularly acute and detrimental in terms of wafer yield and performance.

Another approach has involved increasing the amount of oxidizing agent used in the CMP slurry in an effort to increase chemical removal of targeted material. This approach is largely disfavored as the use of increased amounts of oxidizing agents detrimentally add to the handling issues and environmental issues associated with many oxidizing agents and thus increase costs. Attempts to catalyze the oxidizing agent to increase removal rates have also had limited success. Additional approaches have involved using a combination of CMP slurries, including for example, a zirconium slurry, a combination of abrasive particles in a CMP slurry, and/or using point-of-use mixing techniques. These approaches are generally undesirable, as they typically complicate CMP in terms of tooling and process control for example, consume more process time, and/or increase costs.

Yet another approach has involved trying various abrasive components in the CMP slurry. That is, many of the commonly used abrasive particles, such as alumina, silica, and zirconia, introduce wafer defects, such as scratches or micro-scratches on the wafer surface or abrasive particles that are retained on the wafer surface, which complicate the process of patterning the wafer surface. Composite abrasives, such as aggregates of inorganic particles, such as silica and alumina, and thermoplastic resin particles, have been tried as alternatives to the commonly used abrasives. See, for example, European Patent Application Publication No. EP 1036836 A1 of Yano et al. However, these composite abrasives are typically dispersed in the CMP slurry via ultrasonic irradiation or mechanical shear stress, which may result in the formation of large aggregate particles and/or the presence of disaggregated, hard inorganic particles, which can cause wafer damage or defects, such as micro-scratching, or can be otherwise undesirable.

Various approaches, such as those mentioned above, have been taken in an effort to improve CMP processes used in connection with metals commonly used in the patterning of integrated circuits, such as aluminum-based metals, for example, to reduce wafer damage or defects. However, as semiconductor fabrication processes have evolved, new metals, such as copper-based metals, have come into play. For example, there has been a movement toward using copper and copper alloys in place of aluminum and aluminum alloys in VLSI and ULSI circuits, as copper has a lower resistivity and a significantly higher electromigration resistance than aluminum. Unfortunately, copper-based metal layers are particularly susceptible to the micro-scratching that is associated with the use of commonly used abrasives in CMP slurry compositions and processes.

Generally, two processes have been developed for the CMP of wafers having copper-based surface features. One of these processes is a continuous CMP process involving one CMP composition. While the process is generally designed as a single-step process, the polishing may be accomplished in as many steps as needed. As a general example, an initial process step involving a high downward pressure, such as a pressure of about 3 psi to about 6 psi, for example, may be used to remove the majority of the copper topography at a certain removal rate, and a subsequent process step involving a lower downward pressure, such as a pressure of about 0.5 psi to about 3 psi, for example, may be used to remove the remaining copper and barrier layer at a lower removal rate. See, for example, P. Gopalan, T. Buley, and M. Kulus, *A 90 mm Copper Process with Low Defectivity Using Optimized Copper and Barrier Removal Slurries,* 8th International Chemical-Mechanical Planarization for ULSI Multilevel Interconnect, Feb. 19, 2003, Marina Del Rey, Calif., p. 257. The other of these processes has an initial polishing step that involves one CMP composition and a subsequent polishing step that involves another CMP composition. The initial step and CMP composition are designed for a relatively quick polishing or removal of the copper topography, and the subsequent, step and CMP composition are designed for a relatively slow removal of copper and a relatively fast removal of the barrier layer. See, for example, Y. Yamada, H. Terazaki, and N. Konishi, *Improved Cu Abrasive-Free Polishing for 90 mn Node Process,* 8th International Chemical-Mechanical Planarization for ULSI Multilevel Interconnect, Feb. 19, 2003, Marina Del Rey, Calif., p. 301. Generally, whatever CMP process is used in connection with substrates having copper-based metal features, micro-scratching of the copper-based metal may be of concern.

Further developments in the field of CMP technology are desired.

SUMMARY OF THE INVENTION

The present invention provides a composition for chemical-mechanical polishing that comprises an aqueous solution and an abrasive comprising polymeric particles. Generally, acrylic resin particles or polyacrylate particles, such as polymethyl methacrylate particles, are suitable polymeric particles for use as the abrasive in the CMP composition. The polymeric particles have an electrical charge sufficient to create an electrostatic repulsive force between particles in sufficient proximity to one another. Generally, the polymer particles are electrified more or less uniformly, either positively or negatively, to create a sufficient repulsive force between nearby particles.

Preferably, the mutually repelled, neighboring particles remain substantially discrete, as non-agglomerated or non-aggregated particles. The abrasive thus comprises a substantially uniform distribution of particles of a desirable size, such as a size of about 0.15 microns, about 0.4 microns, or about 1.5 microns, in diameter according to various embodiments. The size distribution may be quite narrow, such as on the order of about 0.15±0.04 microns, 1.5±0.08 microns, or about 1.5±0.20 microns, according to various embodiments. The formation of agglomerate or aggregate particles, such as aggregate particles of non-uniform or undesirable size, is reduced, minimized, or preferably, eliminated.

Preferably, the polymeric particles are in the form of an ultra-fine powder of loose or very loose particles. In this dry formulation, the polymer particles are easily charged via friction electrification to obtain the desired positive or negative charge. Additionally, in this form, the surfaces of the individual particles are easily modified via light mixing with a modifier, such as to produce hydrophilia, or some other property, functionality, or reactivity, such as a desirable ionic content or zeta potential, without damaging the shape or grain size of the particles. Preferably, the surfaces of the polymeric particles are so modified to produce hydrophilic polymeric particles that have good suspension and dispersion stability characteristics when they are dispersed in an aqueous solution. Preferably, the surfaces of the polymeric particles are so modified to produce an ionic content suitable for desirable zeta potential effects.

The composition for chemical-mechanical polishing comprises an aqueous solution and an abrasive comprising polymeric polymers, as described above. The composition need not have an oxidizing agent component, although it may have such a component. Where the composition does comprise an oxidizing agent, the oxidizing agent may be a hydroxylamine, a salt of hydroxylamine, such as hydroxylamine nitrate or hydroxylamine sulfate, for example, or any combination thereof.

Generally, a wider range of chemical additives may be used in the polymer particle abrasive composition of the, present invention, as compared to a composition having a colloidal, fumed, or calcined metal oxide abrasive, as the polymer abrasive particles, because of their electrostatic surface charges, do not undergo the gelling, aggregation, or agglomeration associated with the colloidal, fumed, or calcined metal oxide abrasives. For example, the composition may comprise an additional oxidizing agent, such as nitric acid. The composition may contain a variety of other additives, such as a typical abrasive (i.e., an abrasive comprising particles other than polymeric particles), a surfactant, a stabilizing agent, a dispersion agent, a polish-enhancement agent, and/or a pH-adjusting agent. The pH level of the composition may be in a range of from about 4 to about 8, a preferred range of from about 5 to about 7, and a more preferred range of from about 6 to about 7.

The composition of the present invention may be effective in the CMP of a variety of metal or metal alloy materials on substrates such as silicon or semiconductor substrates. By way of example, the composition may be used in the CMP of a substrate having a metal or metal alloy feature, such as feature comprising aluminum, aluminum alloy, copper, copper alloy, silver, silver alloy, tungsten, tungsten alloy, or any combination thereof, on its surface. Generally, the polishing of a substrate surface involves providing a CMP composition of the present invention on the surface and causing relative motion between the surface and the polishing pad.

The composition may provide desirable material rates in a CMP process. The composition may also provide desirable surface characteristics, for example, a relatively smooth surface having relatively few, if any, microscratches. By way of example, a composition according to the present invention removed about 3581 Angstroms of material from a copper wafer in a five-minute CMP process, which resulted in a relatively smooth wafer surface.

Additional features, aspects and advantages of the present invention will become apparent from the description of preferred embodiments and the various examples set forth below.

DESCRIPTION OF PREFERRED EMBODIMENTS

Figure 1:
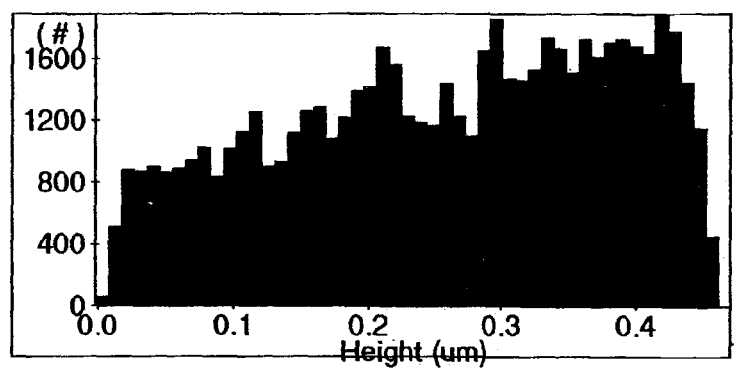
FIG. 1 is a graphical representation of the distribution of features of various heights on the surface of an unpolished copper wafer.

The composition of the present invention is usefully employed in the chemical-mechanical polishing (CMP) of a substrate. The composition or slurry may be used to polish at least one feature or layer on a substrate such as a silicon substrate, a gallium arsenide (GaAs) substrate, a thin film transistor-liquid crystal display ("TFT-LCD") glass substrate, or any other substrate associated with integrated circuits, thin films, semiconductors, Micro Electro Mechanical Systems (MEMS) structures, hard disk platters and heads, and the like. By way of example, the composition of the present invention may be used in the CMP of a substrate having one or more layers of aluminum, an aluminum-containing alloy, copper, a copper-containing alloy, such as a copper-aluminum alloy, silver or a silver-containing alloy, tantalum, titanium, tungsten, or tantalum-, titanium-, or tungsten-containing alloys, such as tantalum nitride, titanium nitride, titanium tungsten, or any combination thereof.

Generally, throughout this description, any mention of "a," "an," or "one," such as "a" component of the composition, refers to at least one, such as at least one such component, for example, one such component or multiple such components. Further, any amount or concentration of a component of the composition is generally given as a weight percent (wt. %) relative to the composition. Additionally, any amount of a component is given as an approximate amount, for example, more or less than, or equal to, the precise numerical amount stated. This convention concerning approximate amounts applies to any numerical measure stated herein in connection with the composition, such as a numerical pH stated for the composition, a numerical amount or concentration of a component of the composition, a numerical size or size distribution for particulate components of the composition, or a numerical process parameter stated for a CMP process employing the composition. The foregoing conventions apply throughout this specification unless specified or clearly intended or implied otherwise.

The composition generally comprises, consists of, or consists essentially of, an aqueous solution and an abrasive comprising polymeric particles. As used herein, "aqueous solution" encompasses water itself, in whatever form, such as pure or deionized water (DI water), in addition to any solution encompassed by a definition of an aqueous solution. For example, the aqueous solution might contain ionic species, such as singly or multiply charged (either positively or negatively charged) ionic species which may be soluble in the solution, to stabilize the static charge on the particles. As used herein, "particles" encompass beads and grains, in addition to any particles encompassed by a definition of particles, and "polymeric particles" includes plastic particles.

The abrasive comprises polymeric particles that are capable of carrying an electrical charge. The polymeric particles are generally flexible and deformable, such that they can adapt to pressure, such as deform under pressure or disperse pressure, such that process pressures that might otherwise lead to microscratches on the surface of the substrate are abated. The polymeric particles preferably have Moh's hardness numbers that are lower than that of conventional particles such as silica particles (Moh's hardness numbers of from 6 to 7) and alumina particles (Moh's hardness numbers of from 6.5 to 8). Merely by way of example, the polymeric particles may have Moh's hardness numbers of from about 0.6 to about 2. The polymeric particles are charged in such a way as to reduce or minimize the formation of large or otherwise undesirable aggregates that may be associated with damage to a metal feature on a substrate surface, such as micro-scratching damage, or defects on a substrate surface, such as the presence of retained abrasive particles, particularly large abrasive particles, for example.

Generally, aggregate particles comprise two or more particles that are closely associated with or bound to one another, via mutual electrostatic attraction, for example. According to the present invention, the polymer particles making up the abrasive component of the composition carry an electrical charge sufficient to create an electrostatic repulsive force between particles in sufficient proximity to one another (i.e., a proximity sufficient for the force to act repulsively on the particles, such as a proximity of from about 1 Å to about 10 Å, for example). In this way, the abrasive comprises substantially discrete polymer particles, or in other words, is substantially free of aggregates or agglomerates of the polymer particles, particularly large ones (i.e., has few instances of aggregates or agglomerates having more than from about 2 to about 3 particles linked together, for example). Should a few aggregated or agglomerated particles be present, preferably they are processed to form or reform individual abrasive polymer particles.

Generally, each polymer particle is more or less spherical and has a diameter of from about 0.01 μm to about 0.15 μm, although individual particle size may vary. Additionally, different particle sizes may be desired for different CMP applications. Merely by way of example, particle diameters may be in the range of from about 0.1 μm to about 1.8 μm, such as from about 0.1 to about 0.2 μm, from about 0.2 to about 0.7 μm, from about 0.7 μm to about 1.1 μm, or from about 1.1 μm to about 1.8 μm, on average, for various CMP applications. By way of example, particles having particle diameters of about 0.2 μm or less may be useful in the CMP of copper, while particles having particle diameters of from about 0.2 μm or more, such as 0.7 μm or more, may be useful in the CMP of aluminum or tungsten.

Acrylic resin particles or polyacrylate particles, such as polymethyl methacrylate (PMMA) particles, polybutyl methacrylate (PBMA) particles, or a combination thereof, are suitable polymeric particles for use as the abrasive in the CMP composition. Examples of other suitable polymeric particles include those comprised of a polyvinyl alcohol, a polyvinyl benzene, such as a polydivinyl benzene or a polymeric vinyl benzene that is cross-linked with at least one sulfonic acid group, a polyvinylidene chloride, a polymelamine, a polypropylene, a polyethylene, such as a polyethylene terephthalate, a polystyrene, a polyester, a polyamide, such as a nylon polyamide polymer, a polyurethane, and any combination thereof. Any combination of the above-mentioned particles, such as a combination of PMMA and PBMA, polyethylene or polystyrene particles, for example, may be used. Unlike some commonly used abrasives, such as fumed silica, the polymeric or plastic particles of the present invention are generally free of significant amounts of chloride ions and irregularly shaped particles, such that relatively little, if any, corrosion or microscratching occurs when a substrate is polished with a composition according to the present invention.

The polymeric particles may become charged in a simple process involving a slight mixing of the particles, which is sometimes referred to as friction blending, friction electrification, or the like. The polymeric particles may become charged via a build up of static charge by virtue of polar groups in the polymer and the insulative nature of the polymeric particles, which generally have a resistivity of above about $10^{14}$ ohms. Other means of imparting charges to the polymer particles may be used. By way of example, particles may be charged by being passed through an electrostatic field (i.e., such as a field established between two plates of different polarity) or through an electrostatic gun, such as that used in dry powder spraying. Further by way of example, a contact electrification process may be used to impart a charge to the particles. In this method, metal particles, such as iron particles of from about 44 μm to about 74 μm in diameter, are mixed with the polymeric or plastic particles, and the resulting particle mixture is sprayed through an electrostatically charged orifice that is covered with a fine mesh. The mesh filters out the iron particles, while the polymeric particles pass through the mesh. Simple mechanical agitation processes, such as pouring the polymeric particles out of a container or shaking the polymeric particles in a container, for example, may also impart an electrostatic charge to the abrasive particles.

A preferred abrasive comprises polymeric particles in the form of an acrylic ultra-fine powder, such as those commercially available from Esprit Chemical Co, of Sarasota, Fla., in particular the "MP Series"™ of products The MP Series™ includes products with grade numbers MP-1000, MP-1100, MP-1201, MP-1400, MP-1401, MP-1450 and MP-1451, each of which is composed of PMMA particles that are hydrophilic and have a negative charge polarity; grade number MP-1220, which is composed of silica-coated PMMA particles that are hydrophilic and have a negative charge polarity; grade number MP-2701, which is composed of silica-coated PMMA particles that are hydrophilic and have a positive charge polarity; grade number MP-3100, which is composed of PMMA particles that are hydrophobic, solvent resistant, and have a negative charge polarity; and grade number MP-4009, which is composed of "PMMA/PBMA" particles (that is, each particle is composed of PMMA and PBMA) that are hydrophobic, have a low softening point, and have a negative charge polarity. The MP-1220 product may be a suitable choice for certain CMP applications, despite the silica coating of its PMMA particles, given the flexibility of the polymer particle core that may allow the particle to polish a surface feature without significant or appreciable microscratching. The MP-3100 product may be a suitable choice for certain CMP applications, despite its hydrophobicity, as it may be less adhesive in relation to a hydrophobic film, such as one of the relatively new, low-conductivity films that may be deposited on a substrate via a chemical vapor deposition process. Because of the surface charge characteristics of the polymer particles of the above-described products, many of these products are used as additives for binary toner products that are used in connection with electrophotographic copiers.

The powder is preferably formulated to possess the functions of both acrylic resin and ultra-fine particles. The particles are preferably polymerized without the use of surfactant to prevent water invasion even in conditions of high humidity, such that the powder is substantially dry. For example, the particles may be formulated to have a water content of less than about 2%. Preferably, the particles are sub-micron in diameter, and are provided in a narrow particle size distribution, although other sizes, such as about 1 micron to about 2 microns in diameter, and other size distributions are possible. The particles may be charged via a slight mixing or blending of them, as described in the above-referenced product literature, or otherwise charged.

According to one embodiment of the invention, the abrasive (Abrasive 1) comprises one of the MP Series of products, namely, MP-1451, certain characteristics of which are set,forth in Table 1 below, including an average zeta potential of about 1.5 mV. According to another embodiment of the invention, the abrasive (Abrasive 2) comprises one of the MP Series of products, namely, MP-1201, certain characteristics of which are also set forth in Table 1 below, including an average zeta potential of about 1.0 mV.

Another preferred abrasive comprises mono-dispersed grains, such as those commercially available from Esprit Chemical Co. of Sarasota, Fla., in particular the "SF Series" of products (including products with product names SF-15, SF-22, SF-30 and SF-65). The grains are preferably formulated to appear as a fine powder, typically white in color. Additionally, the grains are preferably formulated to be substantially dry, having a water content of about 1% or less, for example. Preferably, the grains are provided in a narrow particle size (diameter) distribution, such as bout 1.5±0.2 microns, about 2.2±0.3 microns, and about 3.0±0.4 microns, for example, although other sizes and distributions are possible. The grains may be charged in a manner previously described. According to one embodiment of the invention, the abrasive (Abrasive 3) comprises one of the SF Series of products, namely, SF-15S, certain characteristics of which are set forth in Table 1 below.

Yet another preferred abrasive mono-dispersed beads, such as those commercially available from Esprit Chemical Co. of Sarasota, Fla, in particular the "MX Series"™ of products (including products with product names "MX-150", MX-300, MX-500, MX-1000, MX-1500). The beads are preferably formulated to appear as a fine powder, typically white in color, and preferably substantially dry. Preferably, the beads are provided in a very narrow particle size (diameter) distribution, such as about 1.5±0.08 microns, or about 3.0±0.15 microns, for example, although other sizes and distributions are possible. The beads may be charged in a manner previously described. According to one embodiment of the invention, the abrasive (Abrasive 4) comprises one of the MX Series of products, namely, MX-150, certain characteristics of which are set forth in Table 1 below.

TABLE 1

Characteristics of Various Abrasives

| Abrasive | Polymer Particle Type | Mean Particle Size (μm) | Particle Size Distribution (μm) | Charge Polarity (+ or −) | Mean Zeta Potential (mV) | Hydrophilic Property (yes or no) |
|---|---|---|---|---|---|---|
| Abrasive 1 | PMMA | 0.15 | ±0.04* | — | 1.5 | yes |
| Abrasive 2 | PMMA | 0.4 | ** | — | 1.0 | yes |
| Abrasive 3 | PMMA | 1.5 | ±0.20 | ** | ** | ** |
| Abrasive 4 | PMMA | 1.5 | ±0.08 | ** | ** | ** |

*Estimated
**Unknown

Other examples of possible polymeric particles include the "EPOSTAR™" spherical powders and the "MR Series" of products from the Esprit Chemical Co. of Sarasota, Fla. The "EPOSTAR™" spherical powders are produced from melamine and benzoguanamine homogenous cured resins and have the following particle size characteristics: a mean of about 3 microns, an average of from about 2.5 to about 5 microns, a maximum of about 8 microns, and a minimum of about 0.5 micron, as reported in the product literature, which is incorporated herein by reference. The "MR Series" of products, including products with product names MR-2G, MR-7G, MR-10G, MR-20G, MR-40G, and MR-60G, are composed of about 97 weight percent methylmathacrylate, and about 3 weight percent ethylene glycol dimethacrylate, and have particles sizes of about 2 microns, about 7 microns, about 10 microns, about 20 microns, about 40 microns, and about 60 microns, respectively, and have particle size distributions reported in the product literature, which is incorporated herein by reference. The particles are preferably formulated to appear as a fine powder, typically white in color.

Generally, the polymeric particles are electrified uniformly, either positively or negatively, and to substantially the same or a similar extent, such that an electrostatic repulsive force exists between particles in sufficient proximity to one another. In this way, mutually repulsed particles remain substantially discrete. The abrasive thus comprises a substantially uniform distribution of particles of a desirable size, such as a size of about 0.15±0.04 microns or about 0.4 microns in diameter according to some embodiments, such as that employing Abrasive 1 or Abrasive 2, respectively, or a size of about 1.5±0.20 microns or about 1.5±0.08 microns in diameter according to other embodiments, such as that employing Abrasive 3 or Abrasive 4, respectively. The formation of aggregate particles, such as aggregate particles of non-uniform and/or undesirable size, is reduced or minimized.

Preferably, the polymeric particles are in the form of an ultra-fine powder of loose or very loose particles, beads or grains. In this dry formulation, the polymer particles are easily charged via light mixing or friction electrification to obtain the desired positive or negative charge. Further, when the abrasive formulation is dry, as is preferred, as opposed to wet as in a colloidal silica abrasive, a wider range of modifiers may be used to modify the particle surface to provide some surface characteristic, to modify the ionic content to provide zeta potential effects, to modify the pH of the composition, or to otherwise modify the abrasive, as desired. For example, the surfaces of the individual particles of the loose, dry abrasive are easily modified, such as via light mixing with modification agents, to produce hydrophilia, hydrophobia, lipophilia, or some other property, functionality, or reactivity, such as a desirable ionic content or an acidic or a neutral pH, for example, without damaging the shape or grain size of the particles.

Preferably, the surfaces of the polymeric particles are so modified to produce hydrophilic polymeric particles. Advantageously, hydrophilic polymeric particles generally exhibit good suspension and dispersion stability characteristics when they are dispersed in an aqueous solution. By way of example, and preferably, only about 10% or less of the particles will settle out over 48 hours. Further, the hydrophilic polymeric particles are generally well suited to chemical modification via modification agents and/or via ions in the aqueous solution. Abrasive 1 and Abrasive 2 above are examples of suitable abrasives comprising hydrophilic polymer particles that may be used in a CMP composition of the present invention.

When the electrically charged particles are dispersed in an aqueous solution to form a CMP composition according to the present invention, the composition may have a zeta potential of from about −60 mV to about 10 mV, or preferably, from about −50 mV to about 5 mV, about 2 mV or about 1 mV. By way of example, two different CMP compositions further described herein, one employing Abrasive 1 and the other employing Abrasive 2, have zeta potentials of about 2 mV. The zeta potential of the particles of the abrasive component may differ from that of the formulated composition. For example, in the two compositions just described for which the zeta potentials are about 2 mV, respectively, Abrasive 1 comprises particles with a zeta potential of about 1.5 mV, and Abrasive 2 comprises particles with a zeta potential of about 1.0 mV. Such differences may be attributed to charge redistribution in the formulated composition.

In compositions having particles with reduced zeta potentials, such as less than about 10 mV when the pH is from about 2 to about 7, particles may undesirably settle or agglomerate. Preferably, the aqueous solution of the composition contains enough ionic species to stabilize the zeta potential of the particles, but not too many ionic species such that the static charge of the particles is counterbalanced, causing the particles to aggregate or agglomerate. The ionic species may be metal ionic species, such as those from metal salts, for example, zinc salts. The concentration of ionic species called for may depend on such factors as the nature of the ionic species, the concentration and type of abrasive particles, and the concentration and the type of oxidizer, used in the composition. Generally, the composition may have a greater concentration of ionic species of higher valence. For example, in a composition having ionic species, M, having valences (x) of from +1 to +3, the concentration of ionic species ([$M^x$]) in the composition may tend to follow a pattern of [$M^{+3}$]>[$M^{+2}$]>[$M^{+1}$].

The composition for chemical-mechanical polishing comprises, consists of, or consists essentially of, an aqueous solution and an abrasive comprising polymeric polymers, as described above. The composition need not have an oxidizing agent component, although it may have and preferably does have such a component. That is, according to an embodiment of the invention, the composition for chemical-mechanical polishing comprises, consists of, or consists essentially of, an aqueous solution, an abrasive comprising polymeric particles, and an oxidizing agent. In a composition of the invention, with or without an oxidizing agent, the abrasive may be present in an amount of from about 0.1 to about 10 weight percent, preferably from about 2 to about 6 weight percent, and more preferably, from about 5 to about 6 weight percent, relative to the composition. When the CMP composition comprises an oxidizing agent component, the oxidizing agent generally assists in the chemical removal of targeted material on the substrate surface. The oxidizing agent component is thus believed to enhance or increase the material removal rate associated with the composition.

Preferably, the amount of an oxidizing agent component of the composition is sufficient to assist the chemical removal process, while being as low as possible to minimize handling, environmental, or similar or related issues, such as cost. Effective and suitable amounts of oxidizing agent range from about 0.01 to about 30 weight percent, preferably from about 0.01 to about 10 weight percent, and more preferably, from about 0.01 to about 6 weight percent, while the latter, more preferred amount is particularly preferred in terms of minimizing the potential issues mentioned above.

When the composition comprises an oxidizing agent, the oxidizing agent may be an organic or inorganic hydroxylamine, a salt of hydroxylamine, such as a hydroxylamine nitrate, a hydroxylamine sulfate, a hydroxylamine phosphate, a hydroxylamine halide, such as a hydroxylamine chloride or a hydroxylamine fluoride, or any combination thereof. Examples of other suitable oxidizing agents include those comprised of hydrogen peroxide, periodic acid, a peracetic acid, ammonium persulfate, and any combination thereof. Any combination of the above-mentioned oxidizing agents may be used, provided there are no compatibility obstacles. Hydroxylamine nitrate (HAN) is a preferred primary oxidizing agent for a CMP composition of the present invention. HAN may serve as an oxidizing agent having a pH of from about 3 to about 3.5. HAN is believed to be particularly effective or desirable by virtue of its nitrate anion, which is believed to provide good control over the removal rate for barrier materials, such as a tantalum and/or a tantalum-nitride material that may be present under a copper-based layer.

The composition may comprise an additional oxidizing agent, such as nitric acid for example. The additional oxidizing agent is typically not used as the sole or primary oxidizing agent, and thus, may be referred to as a "secondary" oxidizing agent. Examples of other suitable secondary oxidizing agents include a salt of iron, copper, or cesium, a chelated complex of the foregoing salts, and any combination thereof. Any combination of the secondary oxidizing agents may be used, provided there are no compatibility obstacles. In general, the various secondary oxidizing agents described herein may be used in combination with a primary oxidizing agent or a combination of primary oxidizing agents, although any combination that might undesirably complicate the CMP process is preferably avoided. The composition may contain a variety of other additives, such as a typical abrasive (i.e., an abrasive comprising particles other than polymeric particles), a surfactant, a stabilizing agent, a dispersion agent, a polish-enhancement agent, and/or a pH-adjusting agent, as further described herein.

Examples of CMP compositions according to the present invention, which include an abrasive and an oxidizing agent, are now described. Three such CMP compositions, Composition 1, Composition 2 and Composition 3, the components thereof, and the approximate concentrations of the components ([component]) in approximate weight percent, are set forth in Table 2 below.

TABLE 2

Examples of CMP Compositions

| Composition | Abrasive and [Abrasive] | Oxidizer and [Oxidizer] | Aqueous Solution and [Aqueous Solution] |
|---|---|---|---|
| Composition 1 | Abrasive 1 ~6 wt. % | ~82% HAN Solution ~3 wt. % | DI Water ~91% |
| Composition 2 | Abrasive 2 ~6 wt. % | ~82% HAN Solution ~3 wt. % | DI Water ~91% |
| Composition 3 | Abrasive 3 ~6 wt. % | ~82% HAN Solution ~3 wt. % | DI Water ~91% |

The pH of a CMP composition of the present invention is desirably on the order of from about 4 to about 8, preferably, from about 5 to about 7, and more preferably, from about 6 to about 7. These pH ranges, and particularly the preferred and more preferred ranges, are believed to facilitate control of the CMP process. A composition having a pH that is too low, such as below 2, may present problems in terms of the handling of the composition and the quality of the polishing itself. A composition having a pH that is too high, such as above 11, may detrimentally contribute to corrosion or other attack on the metal layer, such as copper or tungsten, on the substrate surface, depending on the nature of the metal layer. This may not be an issue in the polishing of metal layers such as aluminum or exotic metals, which may tolerate a CMP composition of relatively high pH without ill effect.

Generally, the pH of the composition of the present invention may be adjusted quite easily. This is a quite an advantage over a composition that contains a colloidal abrasive, such as colloidal silica, as the pH of such a composition is quite difficult to adjust because the colloidal suspension is easily destabilized to form gels or large agglomerates.

The pH of the composition of the present invention may be adjusted using an appropriate pH-adjusting agent, such as a suitable acid, base, amine, or any combination thereof. The pH-adjusting agent may contain metal ions. Examples include metal hydroxides, such as sodium hydroxide, potassium hydroxide, and the like, containing sodium, potassium, and like metal ions, respectively. Preferably, a pH-adjusting agent used in the composition does not contain any metal ions that are undesirable or potentially problematic in wafer fabrication, such as sodium, potassium, or copper, for example, such that undesirable metal components are not introduced into the composition. Suitable pH-adjusting agents include amines, such as quaternary amines, ammonium hydroxide, nitric acid, phosphoric acid, sulfuric acid, organic acids, and any combination thereof.

The CMP composition or slurry of the present invention may be prepared as now described. Typically, the water and abrasive components are combined, oxidizer is then added, and the pH is adjusted. The plastic particles of the abrasive component carry an electrical charge or are electrified as previously described. By way of example, a CMP composition according to the present invention may be formulated by providing an aqueous solution, such as DI water, in a container; adding an abrasive, such as Abrasive 1, 2, or 3; and subsequently, adding an oxidizing agent, such as HAN. The result may be a CMP composition such as Composition 1, 2, or 3, respectively, as shown in Table 1. Typically, and preferably, each of the foregoing additions occurs under continuous stirring within the container. The CMP composition may then be adjusted to arrive at a suitable pH, as necessary. For example, any of Compositions 1, 2, and 3, may be titrated with a base, such as ammonium hydroxide, for example, to arrive at a suitable pH. This titration may also occur under continuous stirring within the container. The pH level of the composition may be in a range from about 4 to about 8, about 5 to about 7, or from about 6 to about 7, as previously described. In three exemplary CMP compositions, Compositions 1, 2, and 3 were titrated with ammonium hydroxide to arrive at a pH of about 6.6.

Alternatively, according to one aspect of the present invention, the abrasive may be added to an existing CMP composition, such as a commercially available CMP composition that contains an oxidizing agent. For example, the abrasive may be added to a previously formulated composition, comprising a hydroxylamine or a salt of hydroxylamine as an oxidizing agent, to provide a CMP composition of this invention.

In some applications, particularly an advanced polishing process, the composition may be prepared by adjusting the amount of each composition component in real time, just prior to a re-mixing of the composition at the point of use. For most applications, a prepared composition may be re-mixed at the point of use, whereupon it is poured onto the polishing pad. Typically, the composition is poured onto the pad as the pad is moved or rotated. As the CMP process proceeds, additional slurry may be added or excess slurry may be removed, as desired or necessary.

As mentioned previously, a CMP composition according to the present invention may comprise one or more of various optional additives. Suitable optional additives include surfactants, stabilization agents, dispersion agents, and the like. These optional additives are generally employed to facilitate or promote stabilization of the composition against settling, flocculation (including precipitation, aggregation or agglomeration of particles, and the like), decomposition, and the like. Examples of these optional additives include sulfuric acid, phosphoric acid, nitric acid, ammonium salts, potassium salts, sodium salts, or other cationic salts of sulfates and phosphates, and any combination thereof.

In general, any of these optional additives should be present in an amount sufficient to substantially stabilize the composition. The necessary amount varies depending on the particular additive selected and the particular make-up of the CMP composition, such as the nature of the surface of the abrasive component. If too little of the additive is used, the additive will have little or no effect on the stability of the composition. On the other hand, if too much of the additive is used, the additive may contribute to the formation of undesirable foam and/or flocculant in the composition. Generally, suitable amounts of these optional additives range from about 0.001 to about 2 weight percent relative to the composition, and preferably from about 0.001 to about 1 weight percent. These optional additives may be added directly to the composition in a conventional manner, such as under stirring or other agitation.

While there are many suitable surfactant additives for the composition, preferred surfactant additives include dodecyl sulfate sodium salt, sodium lauryl sulfate, dodecyl sulfate ammonium salt, and any combination thereof. Suitable commercially available surfactants include TRITON DF-16 manufactured by Union Carbide and SURFYNOL manufactured by Air Products and Chemicals.

Stabilization agents may be used to stabilize the CMP composition and/or CMP process. For optimal CMP performance, careful consideration should be given as to whether or not to use a stabilizing agent in the composition, and as to the selection and amount of any stabilization agent added to the composition. Suitable stabilizing agents include organic acids, such as adipic acid, carboxylic acid, citric acid, malonic acid, orthophthalic acid, and ethylenediaminetetraacetic acid, phosphoric acid, phosphonate compounds, nitriles, and other ligands, and any combination of the foregoing agents. As used herein, an acid stabilizing agent refers to both the acid stabilizer and its conjugate base. That is, the various acid stabilizing agents may also be used in their conjugate form. By way of example, herein, an adipic acid stabilizing agent encompasses adipic acid and/or its conjugate base, a carboxylic acid stabilizing agent encompasses carboxylic acid and/or its conjugate base, carboxylate, and so on, for the above-mentioned acid stabilizing agents. Generally, a suitable stabilizer may be used alone or in combination with one or more other stabilizers.

Optionally, certain additives or polish-enhancement agents may be added to the composition to enhance or improve the polishing rate of targeted material on the substrate surface, such as tantalum and titanium material often present in the form of barrier layers on the substrate surface. An example of a polish-enhancement agent is hydroxylamine, which is particularly effective when the targeted material is tantalum. Examples of other suitable polish-enhancement agents include organic derivatives of hydroxylamine, such as diethyl-, isopropyl-, and methyl-hydroxylamine, 3-nitrobenzene sulfonic acid, or an amino-derivative of 3-nitrobenzene. The optional polishing-enhancement agent, if any, is generally present in an amount of from about 0.001 to about 2 weight percent, or preferably, from about 0.001 to about 1 weight percent, relative to the composition.

EXPERIMENTAL EXAMPLES

Experiments were carried out using various examples of a composition according to the present invention. The compositions employed were Compositions 1, 2 and 3, as previously described and shown in Table 2. Each of the compositions was titrated with ammonium hydroxide to arrive at a pH of about 6.5 prior to use in a CMP process, which is further described below.

Each of the compositions was used in a CMP process to polish copper wafers that were three inches in diameter and had about 1 μm of copper deposited on their surfaces via a plasma vapor deposition process. The process was carried out using a PM5 polisher (from LogiTech, Inc. of Westlake, Ohio) equipped with an IC 1000 polishing pad (from Rodel, Inc. of Pheonix, Ariz.). Process parameters included a downward or down-force pressure of 2 pounds per square inch (psi) via the carrier, a carrier speed of about 20 to about 25 revolutions per minute (rpm), a platen speed of 33 rpm, and a composition flow rate of 75 milliliters per minute (ml/min). After the first two minutes of processing, the amount of material removed from the surface of the wafer was measured using a four-point metal film probe (from Four Dimensions, Inc., of Hayward, Calif.) and the material removal rate (Removal Rate I, in Angstroms per minute (Å/min)) was calculated (i.e., the amount removed divided by the two-minute processing time). After 3 additional minutes of processing, the additional amount of material removed from the surface of the wafer was measured using the above-mentioned four-point metal film probe and the material removal rate (Removal Rate II, in Å/min) was calculated (i.e., the additional amount removed divided by the three-minute processing time). Finally, the amount of material removed over the total processing time of 5 minutes (Material Removal, in Å) was calculated. The results are tabulated in Table 3 below.

TABLE 3

Results of a CMP Process for Three CMP Compositions

| Composition | Removal Rate I (Å/min) | Removal Rate II (Å/min) | Material Removed over 5 min (Å) |
|---|---|---|---|
| Composition 1 | 250.9 | 137 | 912.8 |
| Composition 2 | 144.5 | 74 | 511 |
| Composition 3 | 881.4 | 606 | 3580.8 |

For comparison purposes, three comparison slurry compositions, Slurry A, Slurry B, and Slurry C, were prepared. Abrasive-only Slurry A contained a silica abrasive and DI water and had a pH of 6.0. Oxidizer-only Slurry B contained a HAN oxidizing agent and DI water and had a pH of 3.2. Abrasive-plus-oxidizer Slurry C contained a silica abrasive, a HAN oxidizing agent, and DI water, and had a pH of 6.5. In Slurry A and Slurry C, a LUDOX TMA colloidal silica abrasive (from Dupont Abrasives Inc., of Ruabon, Wales, The United Kingdom), composed of 0.05 μm-diameter silica particles and having a pH of between 4 and 7, was used. The comparison slurry compositions, the components thereof, and the concentrations of the components ([component]) thereof in weight percent, and the pH thereof, are set forth in Table 4 below.

TABLE 4

Comparison Slurry Compositions

| Comparison Slurry | Abrasive and [Abrasive] | Oxidizer and [Oxidizer] | Aqueous Solution and [Aqueous Solution] | pH |
|---|---|---|---|---|
| Slurry A | Silica 6 wt. % | None | DI Water 94% | 6.0 |
| Slurry B | None | 82% HAN Solution 3 wt. % | DI Water 97% | 3.2 |
| Slurry C | Silica 6 wt. % | 82% HAN Solution 3 wt. % | DI Water 91% | 6.5 |

Each of the comparison slurries was used in the same CMP process, performed on a three-inch diameter copper wafer with a 1 μm-thick copper film, as was used in connection with Compositions 1, 2, and 3 of the present invention, and the same measurements and calculations were made. The results for Slurry A, Slurry B, and Slurry C are set forth in Table 5 below.

TABLE 5

Results of a CMP Process for the Comparison Slurry Compositions

| Comparison Slurry | Removal Rate I (Å/min) | Removal Rate II (Å/min) | Material Removed over 5 min (Å) |
|---|---|---|---|
| Slurry A | 0 | 1 | 3 |
| Slurry B | 33.23 | 35 | 171.46 |
| Slurry C | 987.4 | 2078 | 8208.8 |

The material removal rates and total material removed for Compositions 1, 2, and 3 of the present invention were better, or significantly higher, than those for abrasive-only Slurry A and oxidizer-only Slurry B, as demonstrated by the data in Table 3 and Table 5. By way of example, the total material removed over the 5-minute process for Composition 1, was over 30 times greater than that of Slurry A, and over 5 times greater than that of Slurry B. For Composition 2, the total material removed over the 5-minute process was over 170 times greater than that of Slurry A, and almost 3 times greater than that of Slurry B. For Composition 3, the total material removed over the 5-minute process was over 1190 times greater than that of Slurry A, and over 20 times greater than that of Slurry B.

While the material removal rates and total material removed for Compositions 1, 2, and 3 of the present invention were lower than those for the abrasive-plus-oxidizer Slurry C, the topographies of copper wafers polished with the compositions of the present invention were significantly better than those of copper wafers polished with the abrasive-plus-oxidizer slurry composition, as demonstrated by FIGS. 1-5, which graphically represent the number of topographical surface features (#) on a copper wafer versus the feature height (μm or Å).

Typically, the topography of an unpolished copper wafer, such as the 3 inch-diameter copper wafer used in the experiments described above, is much like that graphically represented in FIG. 1. That is, there is a broad distribution of features over the range of about 200 Å to about 4500 Å in height, and a significant number of features in an upper range of about 2800 Å to about 4200 Å in height, the median and the mean height being about 2710 Å and about 2590 Å, respectively. The unpolished wafer is relatively rough, having a root mean square (RMS) and average roughness of about 1230 Å and about 1060 Å, respectively.

Figure 2:
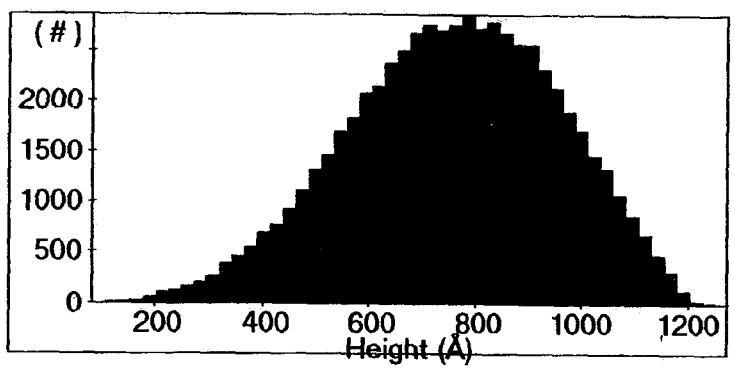
FIG. 2 is a graphical representation of the distribution of features of various heights on the surface of a copper wafer polished with a composition (Composition 1) according to the present invention.

When such a wafer was polished using Composition 1 of the present invention for two minutes, in the manner described previously, the topography of the polished copper wafer was that graphically represented in FIG. 2. As shown, relative to the distribution associated with the unpolished wafer, the distribution is much narrower and is more of a normal, or Gaussian, distribution. The median and the mean height of the topographical surface features were about 770 Å and about 761 Å, respectively, a maximum height being only about 1200 Å. The polished wafer was relatively quite smooth, having a root mean square and average roughness of about 198 Å and about 162 Å, respectively.

Figure 3:
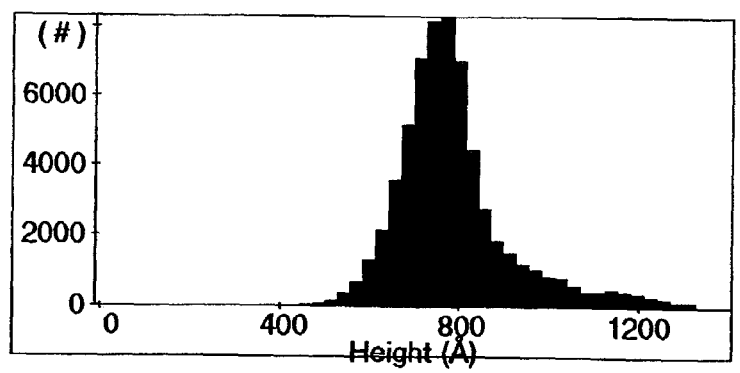
FIG. 3 is a graphical representation of the distribution of features of various heights on the surface of a copper wafer polished with a composition (Composition 2) according to the present invention.

When such a wafer was polished using Composition 2 of the present invention for two minutes, in the manner described previously, the topography of the polished copper wafer was that graphically represented in FIG. 3. As shown, relative to the distribution associated with the unpolished wafer, the distribution is significantly narrower and more normal. The median and the mean height of the topographical surface features were about 774 Å and about 796 Å, respectively, a maximum height being only about 1300 Å. The polished wafer was relatively quite smooth, having a root mean square and average roughness of about 134 Å and about 94.6 Å, respectively.

Figure 4:
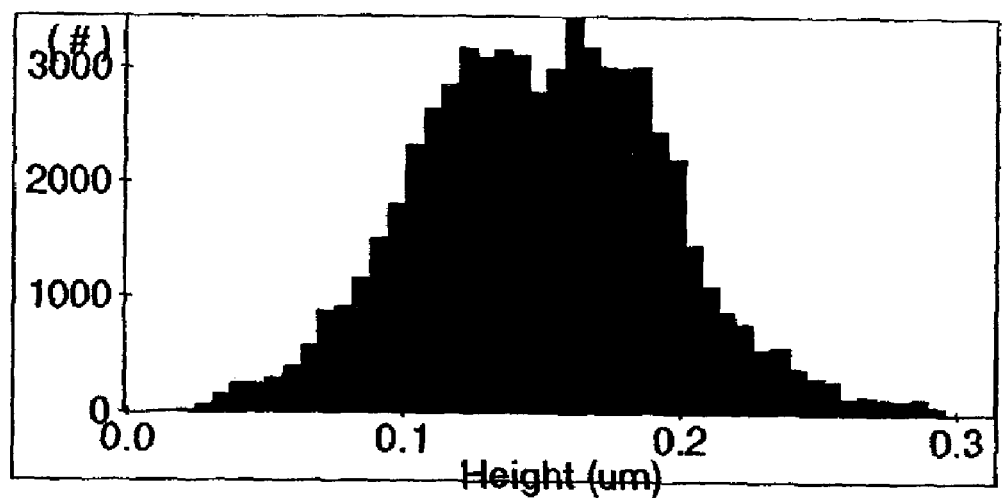
FIG. 4 is a graphical representation of the distribution of features of various heights on the surface of a copper wafer polished with a composition (Composition 3) according to the present invention.

When such a wafer was polished using Composition 3 of the present invention for two minutes, in the manner described previously, the topography of the polished copper wafer was that graphically represented in FIG. 4. As shown, relative to the distribution associated with the unpolished wafer, the distribution is much narrower and more normal. The median and the mean height of the topographical surface features were about 1500 Å and about 1510 Å, respectively, a maximum height being less than 3000 Å. The polished wafer was relatively smooth, having a root mean square and average roughness of about 458 Å and about 368 Å, respectively.

Figure 5:
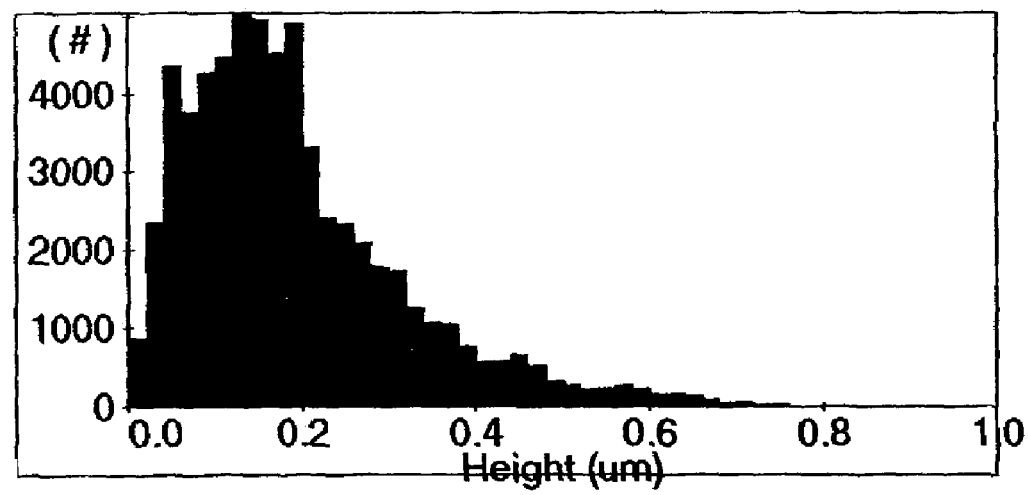
FIG. 5 is a graphical representation of the distribution of features of various heights on the surface of a copper wafer polished with a comparison composition (Slurry C).

By way of comparison, when such a wafer was polished using the abrasive-plus-oxidizer comparison Slurry C for two minutes, in the manner described previously, the topography of the polished copper wafer was that graphically represented in FIG. 5. As shown, relative to the distributions associated with the wafers polished using Composition 1, 2, and 3, the distribution is much less normal or Gaussian, appearing rather skewed, and is much broader. The median and the mean height of the topographical surface features were about 1650 Å and about 1930 Å, respectively, and considerable heights of over 6000 Å were evident. The polished wafer was rougher than the wafers polished using Composition 1, 2, and 3, having a root mean square and average roughness of about 1330 Å and about 994 Å, respectively.

Comparison data is set forth in Table 6 for convenient reference. By way of example, when the topographies of the wafer polished using Composition 1 and the wafer polished using comparative Slurry C are compared, the mean height of the surface features of the former is over 2.5 times less, the maximum of the surface features of the former is about 5 times less, and the average roughness of the former is over 6 times less. Thus, while Composition 1 and Slurry C are the closest in terms of abrasive size, comprising 0.15 µm-diameter polymer particles and 0.05 µm-diameter colloidal silica particles, respectively, their results differ significantly. When the topographies of the wafer polished using Composition 2 and the wafer polished using comparative Slurry C are compared, the mean height of the surface features of the former is over 2.4 times less, the maximum of the surface features of the former is 4.5 to 5 times less, and the average roughness of the former is over 10 times less. These differences are quite significant in the polishing of metal-featured wafers. For example, the considerably better roughness figures associated with the polishing of wafers according to the present invention correlate to better global planarization of the wafers.

TABLE 6

Comparison Data for CMP of a Metal-Featured Wafer Using Various Compositions of the Invention and Comparison Slurry Composition C

| Composition or Comparison Slurry | Median Height (Å) | Mean Height (Å) | Maximum Height (Å) | RMS Roughness (Å) | Mean Roughness (Å) |
|---|---|---|---|---|---|
| Composition 1 | 770 | 761 | 1200 | 198 | 162 |
| Composition 2 | 774 | 796 | 1300 | 134 | 94.6 |
| Composition 3 | 1500 | 1510 | <3000 | 458 | 368 |
| Slurry C | 1650 | 1930 | >6000 | 1330 | 994 |

The experimental examples demonstrate that compositions of the present invention, which contain an abrasive of charged polymer particles and an oxidizer, are more effective and/or more desirable than the silica-abrasive-only Slurry A composition, the oxidizer-only Slurry B composition, and the silica-abrasive-plus-oxidizer Slurry C composition in the CMP of metal-featured substrates, such as copper-featured wafers. For example, as demonstrated herein, the material removal rate may be significantly better using a CMP composition of the present invention. Further by way of example, the topography of metal features on the surface of the wafer may be significantly better when the wafer is polished with a CMP composition of the present invention. The comparison data demonstrates that polishing a metal-featured wafer using a composition of the present invention can provide a relatively narrow and smooth distribution of relatively low surface feature heights and small fissures.

The present invention provides a composition useful for chemical-mechanical polishing of substrates, such as semiconductor wafers, and the metal, adhesion and/or barrier layers thereof. The composition comprises an abrasive component and an aqueous solution. The abrasive component comprises electrically charged polymer particles. Each particle carries a charge of the same polarity, either positive or negative, whether of equal, similar or different magnitude. By virtue of these charges, particles that are in sufficient proximity to one another are mutually repelled. In this way, the particles remain substantially discrete, and are thus able to disperse and remain suspended in the solution. The composition is thus substantially free of abrasive aggregates, or agglomerates, that might otherwise settle out of suspension and/or form an interconnected matrix that might change the characteristics of the composition. Preferably, the polymer particles are formulated as a dry, ultra-fine powder, having hydrophilic properties, such that particle suspension and dispersion stability in the aqueous solution of the composition are good.

The composition may or may not further comprise an oxidizing agent. Thus, the composition may comprise an abrasive as described above, such as Abrasive 1, 2, 3, or 4, and an aqueous solution; or may comprise such an abrasive, an aqueous solution, and an oxidizing agent, as demonstrated by Composition 1, 2 or 3. Other optional additives may be used, such as a pH-adjusting agent, as further described above.

The composition of the present invention may be used in a CMP process, such as that described in the experimental examples, in other conventional CMP processes, such as the one- and two-step processes described in relation to the polishing of copper-featured substrates, or like processes. Generally, in such a process, the composition may be provided on or delivered to the surface of the substrate and relative motion between a polishing pad and the surface of the substrate may be provided, such that polishing of the substrate takes place. The polishing process may be used to remove material, such as a material from a metal feature or layer, an adhesion layer, or a barrier layer on the surface of a substrate. The removal of material may be continued until various features or layers on the substrate are sufficiently or substantially planarized, as desired, as previously described. Preferably, the layers are substantially planarized such that patterning, deposition, lithography, and further processing of the surface, is facilitated or enhanced, as desired.

Various advantages of the composition of the present invention may be attributed to various aspects of its polymeric particle abrasive component. For example, generally, a wider range of chemical additives may be used in the polymer particle abrasive composition of the present invention, as compared to a composition having a colloidal, fumed, or calcined metal oxide abrasive, as the polymer abrasive particles, because of their electrostatic surface charges, do not undergo the gelling, aggregation, or agglomeration associated with the colloidal, fumed, or calcined metal oxide abrasives. When the polymeric particle abrasive formulation is dry, as is preferred, as opposed to wet as in a colloidal silica abrasive, a wider range of modifiers may be used to modify the particle surface to provide some surface characteristic, such as hydrophilicity or hydrophobicity, to modify ionic content to provide desirable zeta potential effects, to modify pH without substantial destabilization, or to otherwise modify the abrasive or the composition, as desired. Advantageously, unlike some commonly used abrasives, such as fumed silica, the polymeric or plastic particles used in the present invention are generally free of significant amounts of chloride ions and irregularly, shaped particles, such that relatively little, if any, corrosion or microscratching occurs when a substrate is polished with a composition according to the present invention.

The composition of the present invention may be advantageously employed in CMP processes to provide good surface topography, as demonstrated herein. Generally, the polymer particles of the abrasive component of the composition may be deformed during the polishing process before the critical pressure associated with microscratching is reached. Thus, microscratching of surfaces, as often attributed to polishing with conventional abrasives such as silica, may be substantially reduced, minimized, or eliminated when a charged polymer abrasive composition of the present invention is used. Advantageously, because of a mutual charge repulsion that is established between the abrasive particles of the composition and the polished surface during a CMP process, after the composition is used in a CMP process, the abrasive particles may be removed from the polished surface of the substrate quite easily. As the abrasives are readily removed from the surface of the substrate, surface defects, as often attributed to polishing with conventional abrasives such as silica, may be substantially reduced, minimized, or eliminated when a charged polymer abrasive composition of the present invention is used.

Various references, publications, pieces of product literature, provisional or non-provisional United States patent applications, foreign patent applications, and/or issued United States or foreign patents, have been identified herein, each of which is incorporated herein in its entirety by this reference. Various aspects and features of the present invention have been explained or described in relation to beliefs or theories, although it will be understood that the invention is not bound to any particular belief or theory. Various modifications, processes, as well as numerous structures to which the present invention may be applicable will be readily apparent to those of skill in the art to which the present invention is directed, upon review of the specification. Although the various aspects and features of the present invention have been described with respect to various embodiments and specific examples herein, it will be understood that the invention is entitled to protection within the full scope of the appended claims.

What is claimed is:

1. A method of preparing a composition for chemical-mechanical polishing, comprising:
    providing an aqueous solution;
    imparting an electrostatic charge to polymeric particles by passing the particles through an electrostatic field, by friction electrification, or by contact with an electrified surface; and
    adding an abrasive comprising the electrostatically charged polymeric particles to the aqueous solution, wherein the polymeric particles in the aqueous solution have an electrical charge sufficient to create an electrostatic repulsive force between proximate particles.

2. A method of preparing a composition for chemical-mechanical polishing, comprising:
    providing an aqueous solution;
    imparting an electrostatic charge to polymeric particles by passing the particles through an electrostatic field, by friction electrification, or by contact with an electrified surface;
    adding an abrasive comprising the electrostatically charged polymeric particles to the aqueous solution, wherein the polymeric particles in the aqueous solution have an electrical charge sufficient to create an electrostatic repulsive force between proximate particles; and
    adding an oxidizing agent to the aqueous solution.

3. The method of claim 1, wherein the particles comprise a material selected from a group consisting of a polyacrylate, a polyvinyl alcohol, a polyvinyl benzene, a polyvinylidene chloride, a polymelamine, a polypropylene, a polyethylene, a polystyrene, a polyester, a polyamide, a polyurethane, and any combination thereof.

4. The method of claim 1, wherein the particles comprise a material selected from polymethyl methacrylate and polybutyl methacrylate.

5. The method of claim 1, wherein the particles have a functionality selected from a group consisting of hydrophilicity and hydrophobicity.

6. The method of claim 1, wherein an average diameter of the particles is from about 0.1 to about 1.8 microns.

7. The method of claim 1, wherein the chemical-mechanical polishing composition further comprises an oxidizing agent.

8. The method of claim 1, wherein the chemical-mechanical polishing composition further comprises an oxidizing agent selected from a group consisting of hydroxylamine, a salt of hydroxylamine, hydrogen peroxide, periodic acid, a peracetic acid, ammonium persulfate, and any combination thereof.

9. The method of claim 8, wherein the oxidizing agent comprises hydroxylamine nitrate.

10. The method of claim 8, wherein the chemical-mechanical polishing composition further comprises a secondary oxidizing agent selected from a group consisting of a salt of iron, copper, or cesium, a chelated complex of any such salt, nitric acid, and any combination thereof.

11. The method of claim 1, wherein the polymeric particles in the chemical-mechanical polishing composition have a zeta potential of from about −60 mV to about 10 mV.

12. The method of claim 1, wherein the composition has a pH of from about 4 to about 8.

13. The method of claim 1, wherein the composition has a pH of from about 5 to about 7.

14. The method of claim 2, wherein the chemical-mechanical polishing composition comprises:
    an aqueous solution;
    an abrasive comprising polymeric particles selected from a group consisting of a polyacrylate, a polyvinyl alcohol, a polyvinyl benzene, a polyvinylidene chloride, a polymelamine, a polypropylene, a polyethylene, a polystyrene, a polyester, a polyamide, a polyurethane, and any combination thereof, wherein the polymer particles are electrified and the polymer particles in said aqueous solution having an electrical charge sufficient to create an electrostatic repulsive force between adjacent particles; and
    an oxidizing agent selected from a group consisting of hydroxylamine, a salt of hydroxylamine, hydrogen peroxide, periodic acid, a peracetic acid, ammonium persulfate, and any combination thereof.

15. The method of claim 14, wherein the particles comprise a material selected from polymethyl methacrylate and polybutyl methacrylate.

16. The method of claim 14, wherein the particles have a functionality selected from a group consisting of hydrophilicity and hydrophobicity.

17. The method of claim 14, wherein an average diameter of the particles is from about 0.1 to about 1.8 microns.

18. The method of claim 14, wherein the oxidizing agent comprises hydroxylamine nitrate.

19. The method of claim 14, wherein the chemical-mechanical polishing composition further comprises a secondary oxidizing agent selected from a group consisting of a salt of iron, copper, or cesium, a chelated complex of any such salt, nitric acid, and any combination thereof.

20. The method of claim 14, wherein the composition has a pH of from about 4 to about 8.

21. The method of claim 14, wherein the composition has a pH of from about 5 to about 7.

22. A method of polishing a substrate surface using a polishing pad, comprising:
providing a substrate having a surface to be polished;
providing the product chemical-mechanical polishing composition resulting from the method of any of claims 1, 7, and 14, on the surface to be polished; and
contacting the surface to be polished having the chemical-mechanical polishing composition thereon with the polishing pad and causing relative motion between the surface and the polishing pad.

23. The method of claim 22, wherein the surface comprises a feature of a material selected from a group consisting of aluminum, copper, silver, tungsten, any alloy of thereof, and any combination thereof.

24. The method of claim 1 or 2, further comprising adjusting a pH of the composition.

25. The method of claim 14, wherein the particles were electrified by passing through an electrostatic field or by contact with an electrified surface.

26. The method of claim 14, wherein the polymer particles have a water content of about 2% or less.

* * * * *